(12) United States Patent
Cremer et al.

(10) Patent No.: US 8,952,436 B2
(45) Date of Patent: Feb. 10, 2015

(54) INTEGRATED DRAM MEMORY DEVICE

(75) Inventors: Sébastien Cremer, Sassenage (FR); Frédéric Lalanne, Bernin (FR); Marc Vernet, Montbonnot-Saint-Martin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 161 days.

(21) Appl. No.: 13/522,862

(22) PCT Filed: Jan. 20, 2011

(86) PCT No.: PCT/EP2011/050739
§ 371 (c)(1),
(2), (4) Date: Sep. 24, 2012

(87) PCT Pub. No.: WO2011/089178
PCT Pub. Date: Jul. 28, 2011

(65) Prior Publication Data
US 2013/0039113 A1 Feb. 14, 2013

(30) Foreign Application Priority Data
Jan. 21, 2010 (FR) ..................... 10 50391

(51) Int. Cl.
*H01L 27/108* (2006.01)
*H01L 23/48* (2006.01)
(Continued)

(52) U.S. Cl.
CPC ........ *H01L 27/10882* (2013.01); *G11C 11/404* (2013.01); *G11C 11/4094* (2013.01); *H01L 27/0207* (2013.01); *H01L 27/10814* (2013.01); *H01L 27/10852* (2013.01);
(Continued)

(58) Field of Classification Search
USPC .......... 257/296, 303, 306, 390, 758, E21.019, 257/E21.577, E21.66, E21.648, E27.084, 257/E27.088, E27.104; 438/3, 253, 622
See application file for complete search history.

(56) References Cited

U.S. PATENT DOCUMENTS 5,578,847 A * 11/1996 Aoki et al. ..................... 257/296
5,714,779 A * 2/1998 Auer et al. ..................... 257/306
(Continued)

FOREIGN PATENT DOCUMENTS

CA 2379921 A1 9/2002
GB 2274741 A 8/1994

OTHER PUBLICATIONS

International Search Report and Written Opinion for PCT/EP2011/050739 mailed Jul. 28, 2011 (20 pages).
(Continued)

*Primary Examiner* — Dao H Nguyen
(74) *Attorney, Agent, or Firm* — Gardere Wynne Sewell LLP

(57) ABSTRACT

A DRAM memory device includes at least one memory cell including a transistor having a first electrode, a second electrode and a control electrode. A capacitor is coupled to the first electrode. At least one electrically conductive line is coupled to the second electrode and at least one second electrically conductive line is coupled to the control electrode. The electrically conductive lines are located between the transistor and the capacitor. The capacitor can be provided above a fifth metal level.

22 Claims, 14 Drawing Sheets

(51) Int. Cl.
   *H01L 21/00*      (2006.01)
   *G11C 11/404*     (2006.01)
   *G11C 11/4094*    (2006.01)
   *H01L 27/02*      (2006.01)
   *H01L 49/02*      (2006.01)
   *H01L 23/522*     (2006.01)

(52) U.S. Cl.
   CPC ... *H01L 27/10885* (2013.01); *H01L 27/10891* (2013.01); *H01L 27/10894* (2013.01); *H01L 27/10897* (2013.01); *H01L 28/91* (2013.01); *H01L 23/5223* (2013.01)
   USPC ........... 257/296; 257/303; 257/306; 257/390; 257/758; 257/E21.019; 257/E21.577; 257/E21.66; 257/E21.648; 257/E27.084; 257/E27.088; 257/E27.104; 438/3; 438/253; 438/622

(56) References Cited

U.S. PATENT DOCUMENTS

| | | | | |
|---|---|---|---|---|
| 6,150,689 | A  * | 11/2000 | Narui et al. | 257/306 |
| 6,479,899 | B1 * | 11/2002 | Fukuda et al. | 257/758 |
| 7,642,572 | B2 * | 1/2010  | Popp et al. | 257/211 |
| 2001/0028588 | A1 | 10/2001 | Yamada et al. | |
| 2002/0153539 | A1 * | 10/2002 | Miyamoto et al. | 257/209 |
| 2002/0182847 | A1 * | 12/2002 | Yokoyama et al. | 438/622 |
| 2002/0192901 | A1 * | 12/2002 | Kimura et al. | 438/253 |
| 2004/0029298 | A1 * | 2/2004 | Casagrande et al. | 438/3 |
| 2004/0190350 | A1 | 9/2004 | Wada | |
| 2004/0232497 | A1 * | 11/2004 | Akiyama et al. | 257/390 |

OTHER PUBLICATIONS

INPI Search Report and Written Opinion for FR 1050391 mailed Aug. 24, 2010 (12 pages).

* cited by examiner

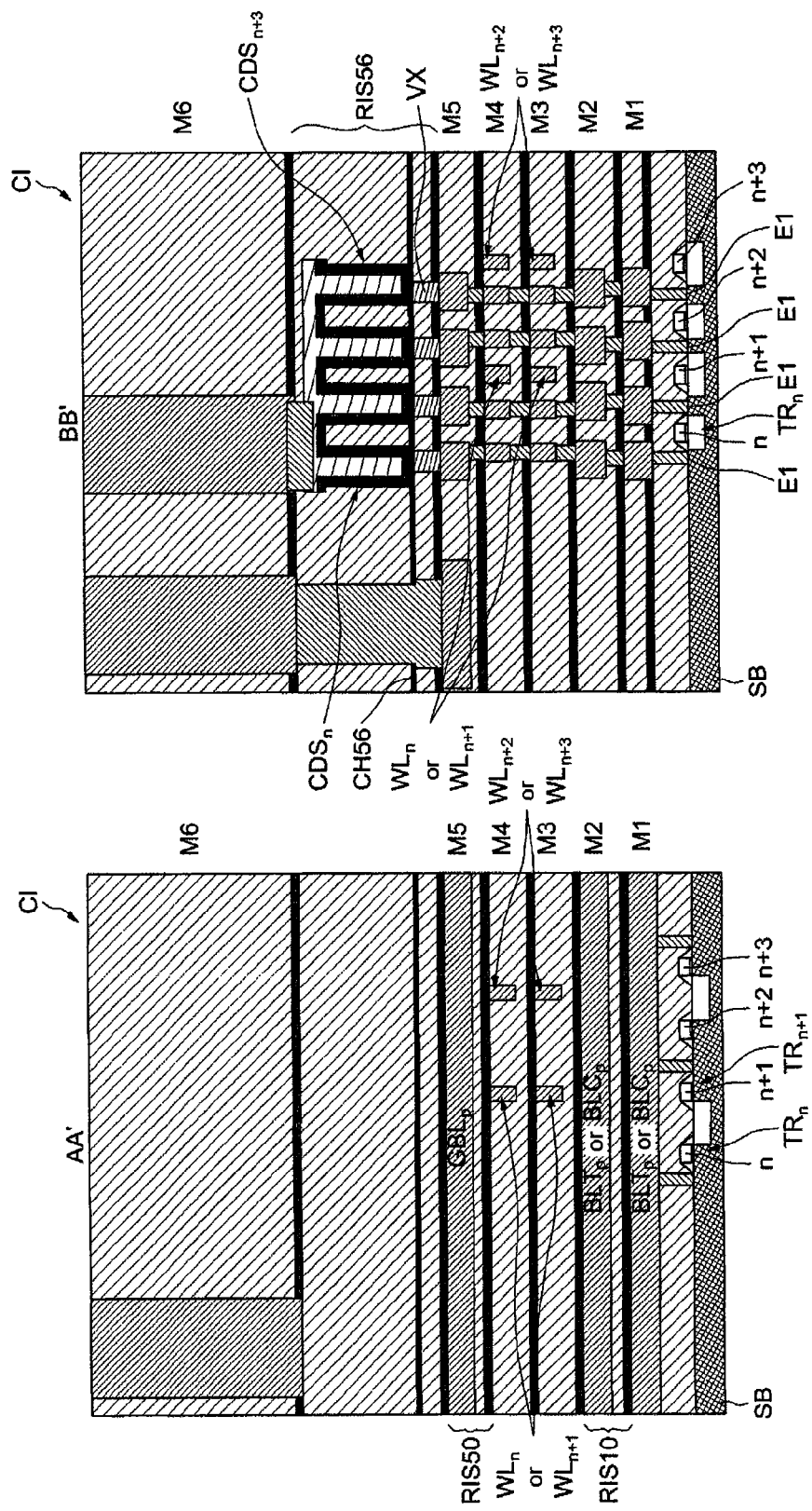

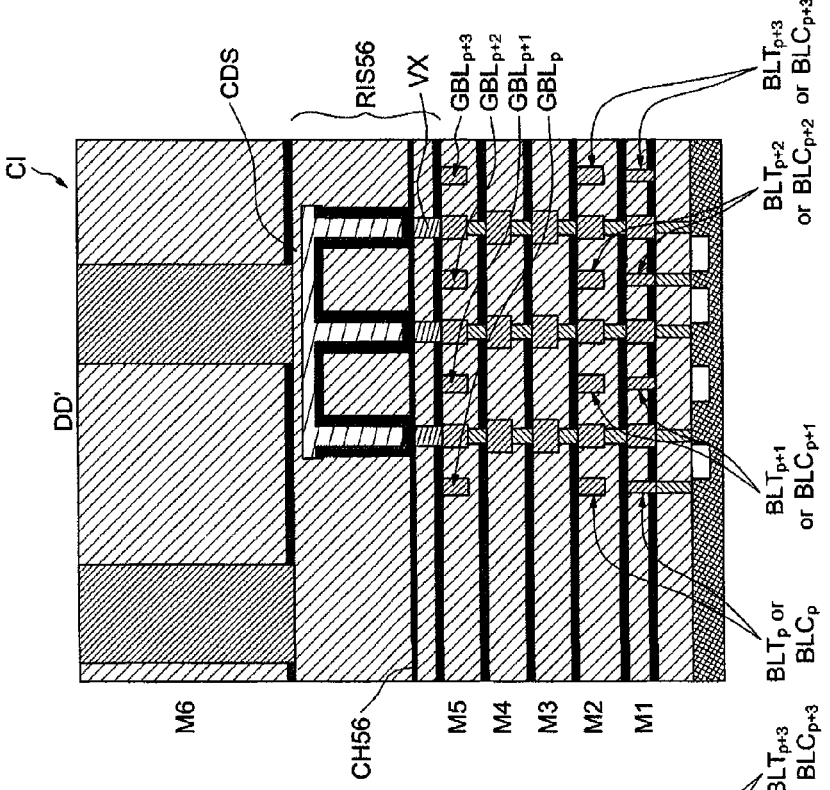
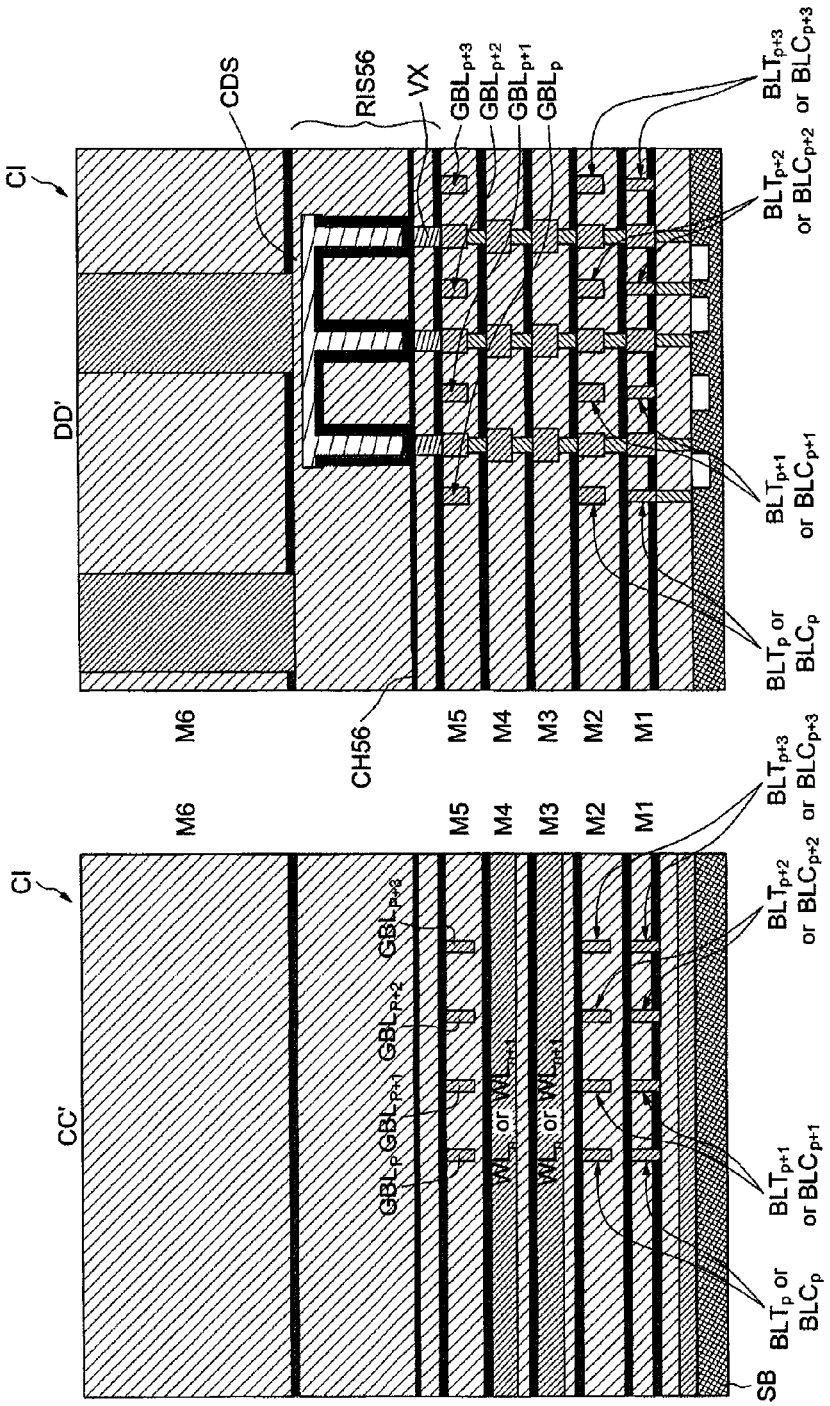

INTEGRATED DRAM MEMORY DEVICE

PRIORITY CLAIM

This application is a 371 filing from PCT/EP2011/050739 filed Jan. 20, 2011. which claims priority from French Application for Patent No. 1050391 filed Jan. 21, 2010, the disclosures of both of which are hereby incorporated by reference.

TECHNICAL FIELD

The invention relates to integrated circuits, in particular those incorporating a dynamic random access memory (DRAM), and most particularly embedded DRAM memory, that is to say memories that are fabricated on the same integrated circuit as that containing another component, for example a processor, as opposed to external DRAM modules that are fabricated on a specific external integrated circuit different from the one containing a processor.

SUMMARY

According to one embodiment, an embedded DRAM memory is proposed that can be fabricated using standard process technology while still offering the option of having high-capacitance memory cell capacitors.

According to another embodiment, it is proposed to fabricate such a DRAM memory using an advanced technology, for example 65 nm or sub-65 nm technology, in particular 32 nm technology.

According to one aspect, an integrated circuit comprising a DRAM memory device, advantageously embedded, is proposed, comprising at least one memory cell including a transistor having a first electrode, for example the source, a second electrode, for example the drain, and a control electrode, for example the gate, and a capacitor, for example a three-dimensional capacitor, coupled to said first electrode. The memory device also comprises at least a first electrically conducting line, generally called a "bit line", coupled to the second electrode and at least a second electrically conducting line, generally denoted by "word line", coupled to the control electrode, said electrically conducting lines being placed between the transistor and the capacitor.

In other words, according to one embodiment the DRAM memory cell capacitor here is located in the integrated circuit, relative to the transistor, higher than the bit line and the word line, which has the advantage of enabling the capacitor to be fabricated in relatively thick insulating inter-metal regions of the integrated circuit, and in any case thicker than the insulating regions encompassing and separating the metallization levels in which the bit line or lines and the word line or lines are fabricated.

Thus, a capacitor, preferably a three-dimensional capacitor, may be fabricated with relatively large dimensions and therefore a high capacitance even when the memory cell is fabricated using an advanced technology, for example 32 nm technology, resulting in smaller footprints and therefore in a high density of logic signals to be transmitted.

Moreover, the word line or lines and the bit line or lines may be fabricated in lower metallization levels using a standard process.

According to one embodiment, said first and second electrically conducting lines are fabricated within certain integrated-circuit metallization levels and the capacitor is fabricated between two metallization levels within an insulating region thicker than the insulating regions containing the metallization levels within which said electrically conducting lines are fabricated.

Thus, by way of an exemplary implementation, the capacitor may be fabricated above the fifth metallization level, between the fifth and the sixth metallization level.

According to one embodiment, each first electrically conducting line extends, principally, in a first direction, for example vertically, each second electrically conducting line extends, principally, in a second direction, for example horizontally, and the active region of the transistor then extends, principally, in a third direction different from the first direction and from the second direction.

This enables the capacitor to be easily connected to the first electrode of the transistor by way of a via stack and of metal track portions without contacting the bit line or lines or the word line or lines.

By way of example, the active region of the transistor may extend obliquely to the general orientation of the bit lines and word lines.

According to one embodiment, the memory device comprises an array of DRAM memory cells, a set of first electrically conducting lines coupled to the second electrodes of the memory cell transistors and a set of second electrically conducting lines coupled to the control electrodes of the memory cell transistors, all these sets of lines being respectively fabricated within different metallization levels, and the memory cell capacitors are fabricated above all these sets of electrically conducting lines.

According to one embodiment, so as to read data from and/or write data to the memory cells, the memory device furthermore comprises a set of additional electrically conducting lines, denoted "global bit lines", coupled to the first electrically conducting lines, that is to say to the bit lines, this set of additional lines being fabricated in at least one metallization level located above those containing the sets of first and second lines.

Moreover, the memory cell capacitors may be fabricated above the set of additional electrically conducting lines.

In other words, in such an embodiment, the global bit lines are fabricated above the bit lines and the word lines, and the memory cell capacitors are fabricated above these global bit lines.

As a variant it is possible to fabricate the additional lines in at least one metallization level located above the capacitors. This produces lower-capacitance global bit lines.

So as to make the respective capacitances of the bit lines equal, and so as to make the respective capacitance of the word lines equal, the set of first electrically conducting lines comprises metal tracks extending so as to be superposed and twisted pairwise over two different metallization levels and the set of second electrically conducting lines comprises other metal tracks also extending so as to be superposed and twisted pairwise over two other different metallization levels.

Moreover, according to one embodiment, each additional line (global bit line) is placed above a metal track of the set of first electrically conducting lines.

In other words, each global bit line is located above a bit line.

According to one embodiment, the set of first electrically conducting lines is fabricated in the first and second metallization levels whereas the set of second electrically conducting lines is fabricated in the third and fourth metallization levels, and the set of additional electrically conducting lines is fabricated in the fifth metallization level.

All the memory cell capacitors are preferably fabricated in the same insulating region, which may for example be located between the fifth and the sixth metallization level.

According to one embodiment, the set of additional lines comprises pairs of additional lines for writing data to the memory cells, and pairs of additional lines for reading data from the memory cells. The integrated circuit then furthermore comprises several first precharge circuits assigned to each pair of additional lines for writing data, and several second precharge circuits assigned to each pair of additional lines for reading data. First control means are then configured for simultaneously activating all the first precharge circuits assigned to a pair of lines and second control means are configured for simultaneously activating all the second precharge circuits assigned to a pair of lines.

Such an embodiment enables the high capacitance of the additional lines to be compensated for and therefore makes it possible to decrease the time required to precharge the additional lines so as to increase the operating frequency of the memory.

By way of example, when the memory-cell array is subdivided into array sections, at least some of the first precharge circuits assigned to each pair of additional lines for writing data are located between certain sections and at least some of the second precharge circuits assigned to each pair of additional lines for reading data are located between certain sections.

In practice, a precharge circuit may be placed at each end of a pair of additional lines and other precharge circuits may be placed every n array sections, n being an integer less than the number of sections.

According to one embodiment the integrated circuit may furthermore comprise at least one additional capacitor, of identical structure to each memory cell capacitor, and located in the same integrated-circuit insulating region containing each memory cell capacitor.

Such an additional capacitor may for example be used to decouple two metallization levels and is thus advantageously fabricated using the same process technology used to fabricated the memory cell capacitors.

BRIEF DESCRIPTION OF THE DRAWINGS

Other advantages and features of the invention will become clear on examining the detailed description of embodiments, which are in no way limiting, and the appended drawings, in which:

FIGS. 10 to 14 illustrate, in greater detail, certain features of the integrated circuit of FIG. 9;

DETAILED DESCRIPTION OF THE DRAWINGS

Figure 1:
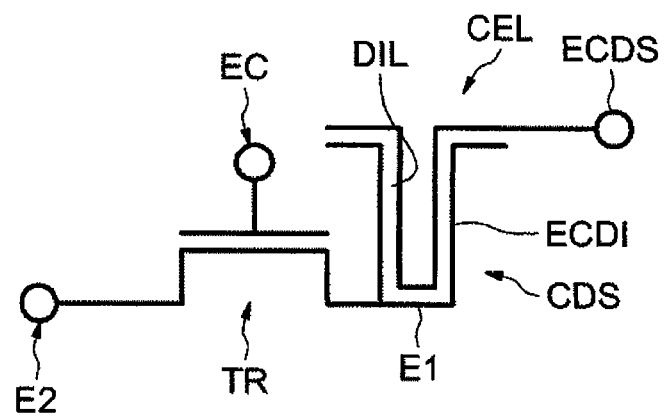
FIG. 1 illustrates schematically the structure of a DRAM memory-cell.

In FIG. 1, the reference CEL denotes a DRAM memory cell comprising a transistor TR having a first electrode E1, for example the source, a second electrode E2, for example the drain, and a control electrode EC, typically the gate of the transistor.

The memory cell CEL also comprises a capacitor CDS, generally a metal-dielectric-metal capacitor having a bottom electrode ECDI generally made of metal and a top electrode ECDS generally made of metal, separated from each other by a dielectric region DIL.

The bottom electrode ECDI of the capacitor CDS is connected to the source E1 of the transistor TR.

As will be seen in more detail below, the memory cell capacitor is located above the bit lines and word lines, thereby enabling the capacitor to be fabricated between high metallization levels of the integrated circuit. This has its advantages whatever the technology used, but it is particularly beneficial when advanced technologies are used, typically 65 nm or sub-65 nm technology, for example 32 nm technology, in which the density and form factor constraints are important.

Figure 2:
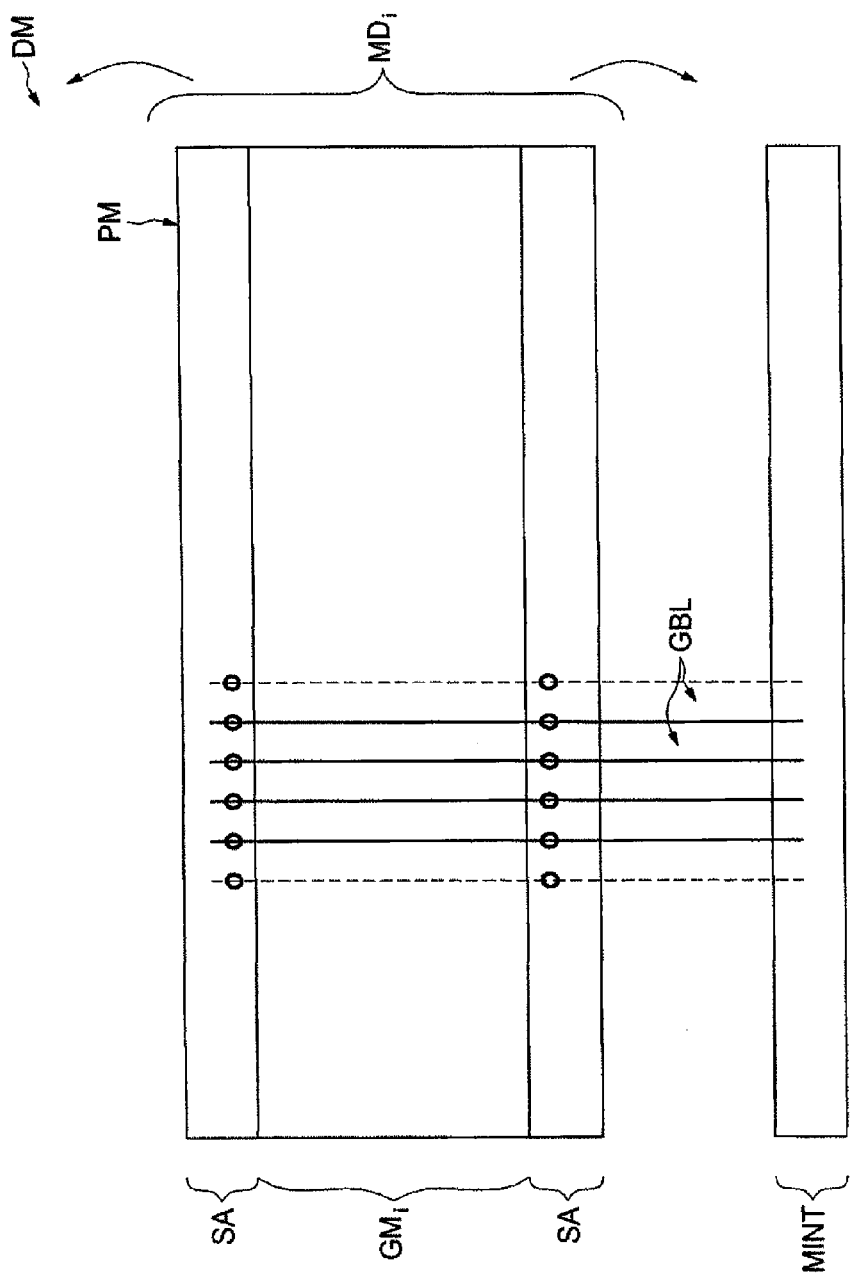
FIG. 2 illustrates schematically an embodiment of a memory device according to the invention.

Generally, as illustrated in FIG. 2, the memory device DM comprises a memory plane PM organized into array sections $MD_i$.

Each section $MD_i$ comprises an array group $GM_i$ of DRAM memory cells organized, for example, in rows and columns.

By way of non-limiting indication, each array group $GM_i$ may comprise 128 rows and 1024 columns. Moreover, the number of sections $MD_i$ may range up to 32.

In the example given here, stages of conventionally structured sense amplifiers SA, known per se, are placed at each end of the section $MD_i$ and are connected to global bit lines GBL—more details of the structure and operation of the global bit lines will be given below. Even so, it is already possible to say that these global bit lines are organized in pairs and serve for reading data from or writing data to the memory cells.

These global bit lines must be, in particular, precharged to a reference voltage (the supply voltage Vdd for the global bit lines intended for reading, and ground for the global bit lines intended for writing).

These precharge circuits dedicated to the read and write global bit lines are particularly placed in a memory interface MINT.

Figure 3:
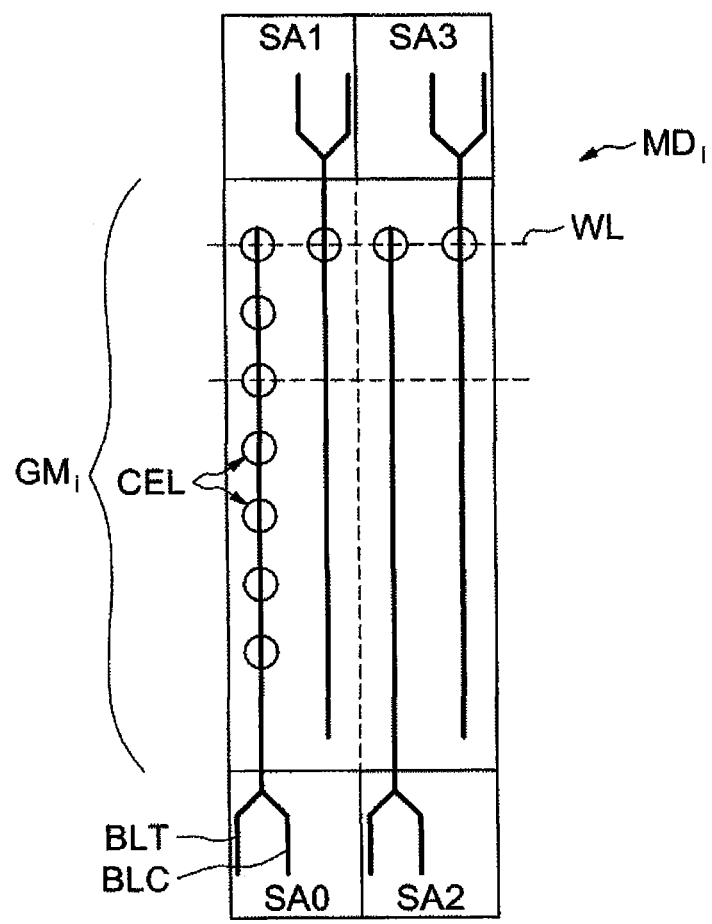
FIGS. 3 to 8 illustrate, in greater detail but still schematically, other features of an embodiment of a memory device according to the invention and, in particular, an example of an arrangement of metal tracks on a memory plane according to the invention.

FIG. 3 shows, by way of example, a section $MD_i$ comprising four columns and seven rows.

The second electrodes E2 (drains of the transistors) of the cells in one and the same column are connected to a bit line BLT or BLC, whereas the gates of the transistors TR of the cells of one and the same row are connected to an electrically conducting word line WL.

Each sense amplifier $SA_i$ is connected to the two bit lines BLT, BLC. Depending of the cell to be read, one of these lines conventionally serves as a reference line, as is known per se.

In practice, the two bit lines BLT and BLC assigned to one and the same column, are superposed and cross over each other, or twist, at regular intervals, changing metallization level, particularly so as to make the capacitances of the bit lines BLT and BLC equal. The various bit lines are thus in practice pairwise twisted.

These various bit lines extend in superposition over two adjacent metallization levels of the integrated circuit, for example the metallization levels 1 and 2.

Figure 4:
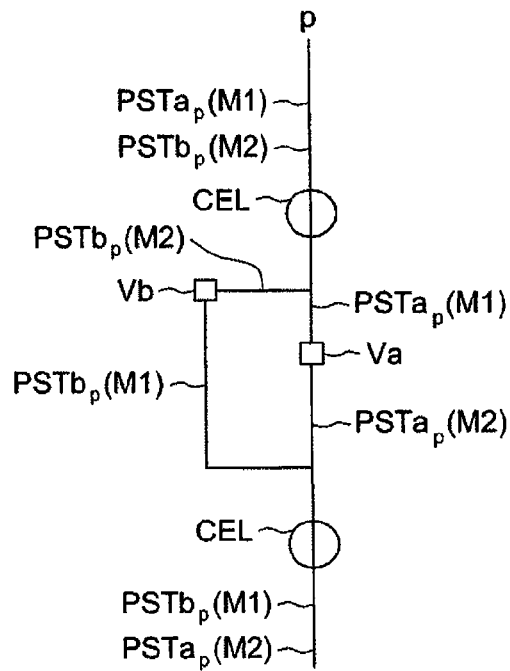
Figure 5:
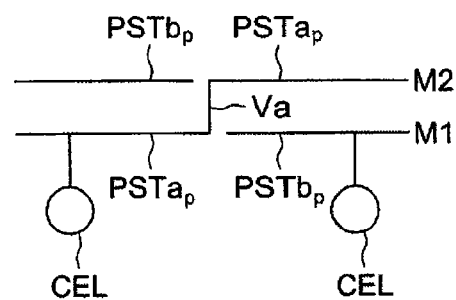

This is illustrated schematically in FIGS. 4 and 5.

More precisely, if a column of row p is considered, FIG. 4, a schematic top view of the bit lines, and FIG. 5, a schematic vertical cross section of the column, show that a metal track PSTa$_p$ extends firstly in the metallization level M1 so as to connect certain memory cells CEL, whereas a metal track PSTb$_p$ extends in the metallization level M2 above the track PSTa$_p$ without connecting to a memory cell.

Then, at a given location, for example every 32 memory cells, the two tracks PSTa$_p$ and PSTb$_p$ cross over, or twist, i.e. they change metallization level.

This crossover or twist is achieved by way of vias or interconnecting holes.

More precisely, the track PSTb$_p$ turns off from the metallization level M2, so as to drop down to the metallization level M1 by way of the via Vb, before returning and once more extending along the column in the metallization level M1, so as to connect other cells CEL.

The track PSTa$_p$ rises up from the metallization M1 to the metallization M2 by way of the via Va and continues to extend along the column, now however above the track PSTb$_p$.

Another twist and another level change occurs 32 cells further on.

Each of the tracks PSTa$_p$ and PSTb$_p$ then forms, alternately, a part of the bit lines BLT or BLC.

It is clear that all the cells CEL are connected to metal tracks located in the metallization level M1.

This twisting of the metal tracks enables the capacitances of the various bit lines to be made equal.

The pairs of bit lines BLT and BLC are then connected, as is conventional, to the sense amplifiers.

The above description of the bit lines is equally applicable to the word lines WL which extend so as to be vertically superposed and twisted pairwise over two adjacent metallization level, for example metallization levels 3 and 4.

Figure 6:
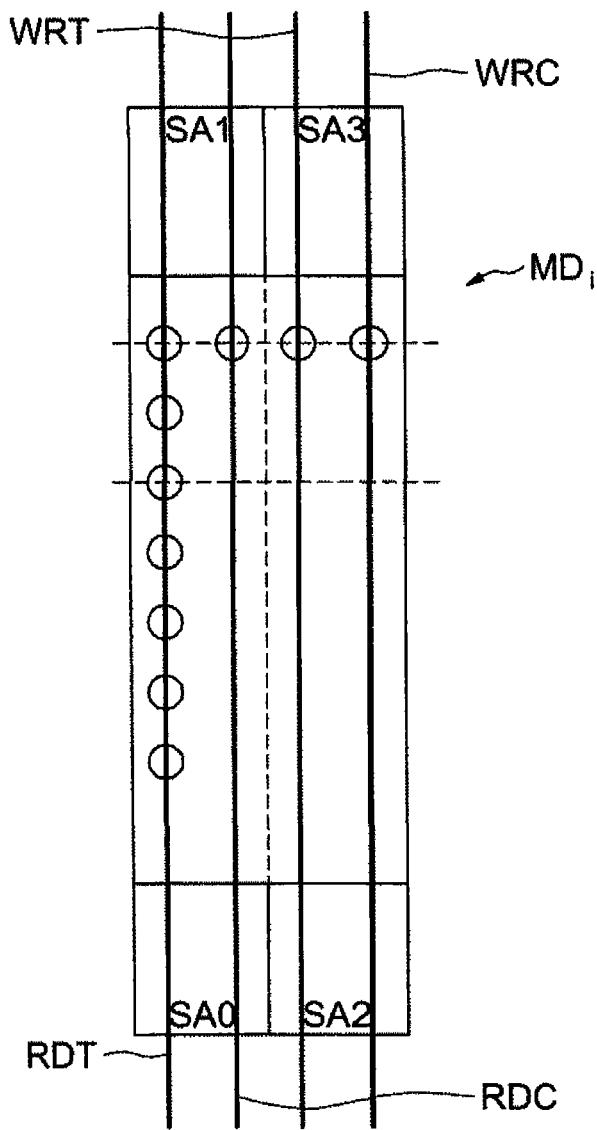

Above these bit lines and these word lines, for example in the metallization level 5, the global bit lines GBL are fabricated and organised in pairs for reading or writing data (FIG. 6).

More precisely, the global bit lines for reading are denoted RDT and RDC, whereas the global bit lines for writing are denoted WRT and WRC.

The global bit lines are located above the bit lines and are connected to the various sense amplifiers.

Figure 7:
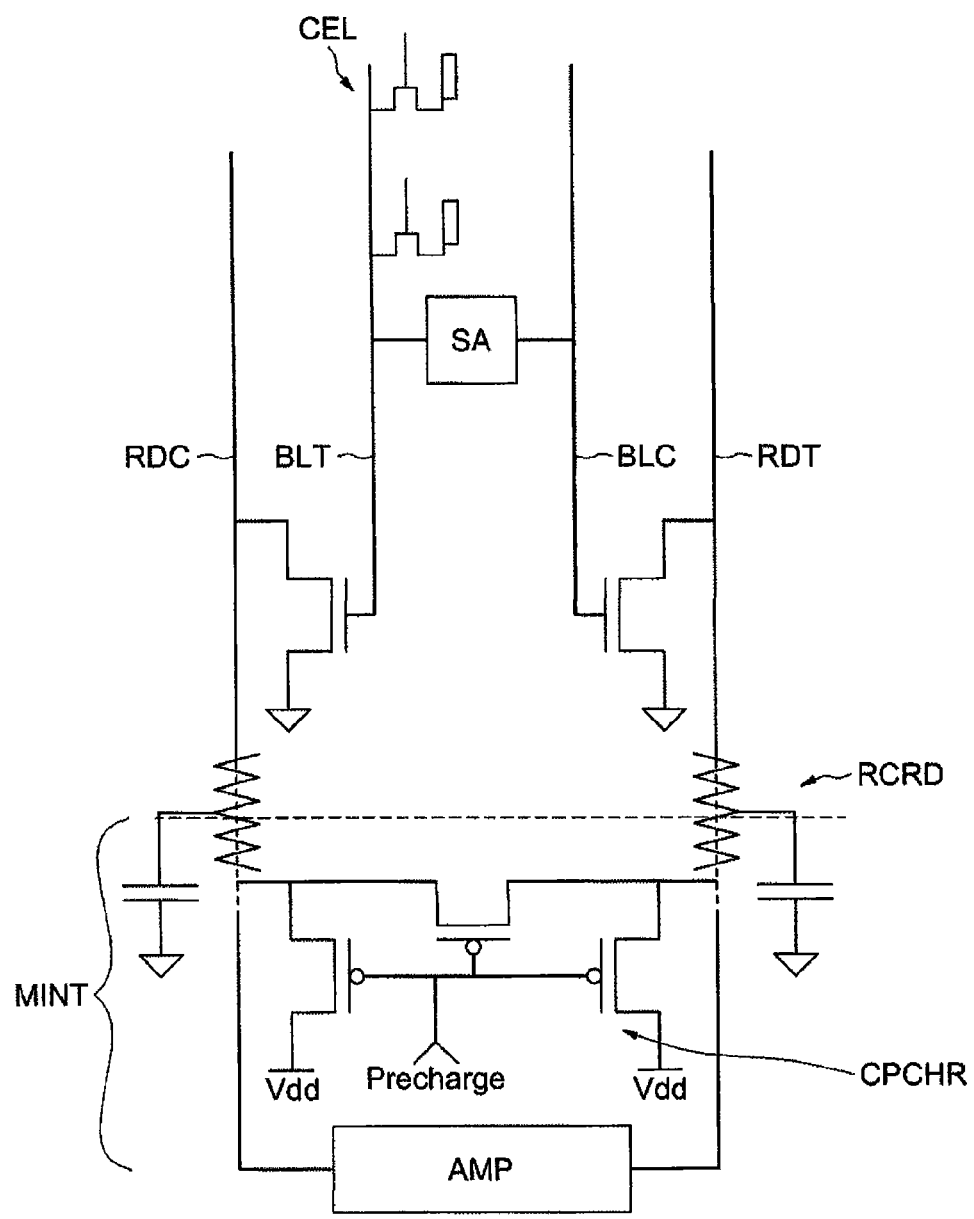
Figure 8:
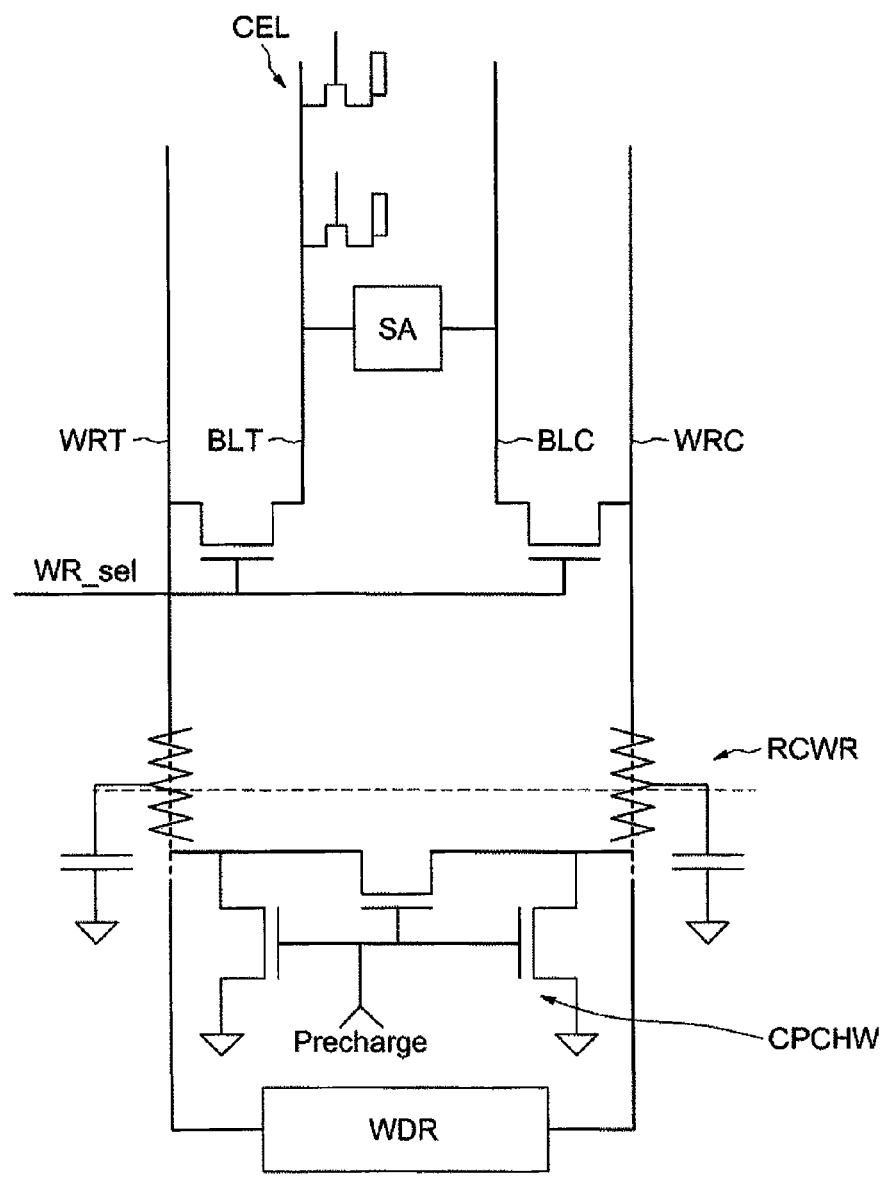

These connections are illustrated in greater detail, but still schematically, in FIG. 7, as regards the global bit lines for reading, and in FIG. 8, as regards the global bit lines for writing. In these two figures, the lines BLT and BLC, that are in reality superposed, have been shown side by side for the sake of simplicity and clarity.

More precisely, FIG. 7 shows that the global line RDC is connected to the bit line BLT and consequently to the sense amplifier SA by way of a transistor. The same is true for the global bit line RDT that is connected to the bit line BLC and therefore to the sense amplifier SA by way of another transistor.

Here again, one of the two global lines RDT or RDC serves as a reference depending on the memory cell to be read.

These two global lines RDT and RDC are connected to a conventionally structured input/output amplifier AMP, known per se, placed for example in the interface MINT.

Furthermore, a conventionally structured precharge circuit CPCHR, known per se, is also placed in the memory interface MINT and connected to the lines RDT and RDC so as to precharge them to the voltage Vdd using a control signal referenced "Precharge".

As will be shown in more detail below, because of the high resistance and high capacitance RCRD of the lines RDT and RDC, it is particularly advantageous in certain applications to provide several precharge circuits distributed along these lines RDT and RDC. As regards the global lines for writing WRT and WRC, they have an analogous structure, as illustrated in FIG. 8.

More precisely, the global lines WRT and WRC are also connected to the bit lines BLT and BLC by way of select transistors controlled by a select signal WR_sel.

These write lines WRT and WRC are controlled by a conventionally structured driver WDR, known per se. The write lines are moreover precharged by a conventionally structured precharge circuit CPCHW, known per se, and controlled by a control signal Precharge.

Here again, as will be shown in more detail below, because of the high resistive and capacitive load RCWR of these lines WRT and WRC, for certain applications several precharge circuits are provided along these lines WRT and WRC.

Figure 9:
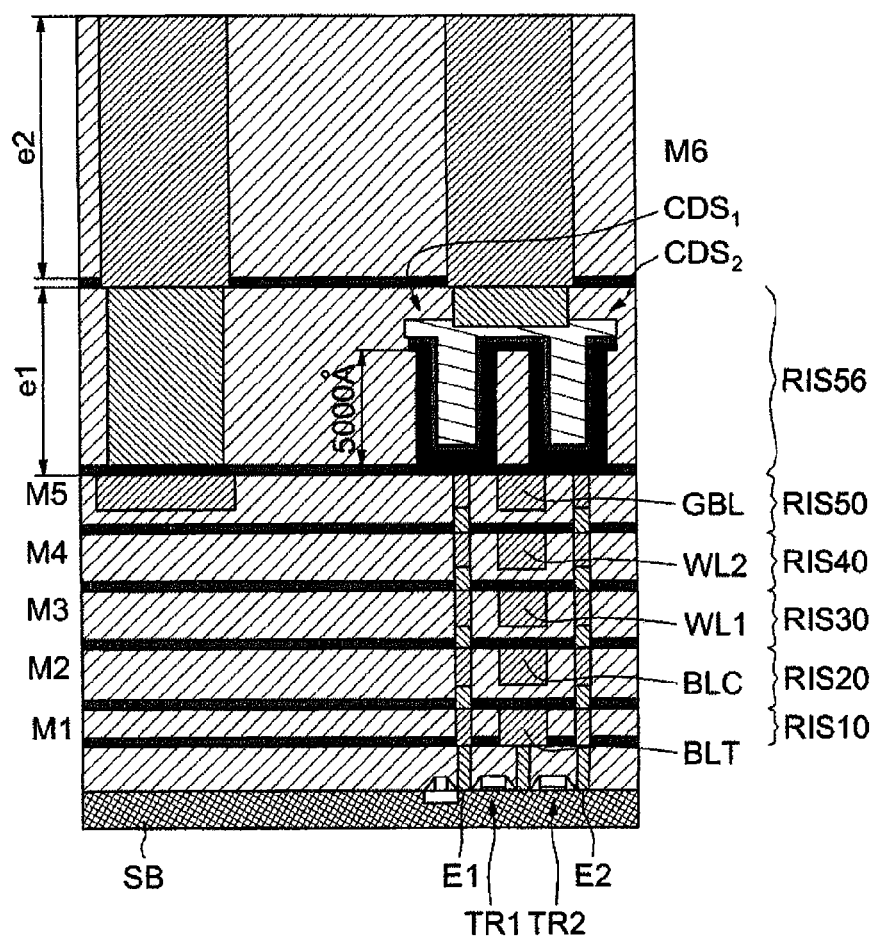
FIG. 9 illustrates schematically an embodiment of an integrated circuit according to the invention incorporating a DRAM memory device.

FIG. 9 shows a diagram representing the principle of an integrated circuit IC according to one embodiment of the invention, in which two DRAM memory cells have been shown very schematically for the sake of simplicity. Such a diagram aims to represent, very schematically, certain features of the integrated circuit—this diagram does not corresponds to any one section plane.

As is conventional in the field, an integrated circuit comprises above active elements fabricated in a substrate SB, for example transistors, a BEOL (back end of line). This BEOL comprises metallization levels within which are fabricated metal tracks for interconnecting the various logic elements of the integrated circuit. These metal tracks are separated from one another within one and the same metallization level by an inter-track dielectric and two adjacent metallization levels are also separated from each other by one or more inter-level dielectrics. All these dielectrics form an insulating region RIS formed here, for example, by a layer of silicon nitride surmounted by a low-k material, for example SiOC.

The insulating regions RIS10, RIS20, RIS30, RIS40 and RIS50, within which the metallization levels M1, M2, M3, M4 and M5 are fabricated, respectively, are relatively thin having a thickness typically of about 2000 ångströms in 32 nm technology.

In fact, the metallization levels M1-M5 are in particular used in the integrated circuit to route logic signals.

On the other hand, above the metallization level M5 the insulating region RIS56 separating the metallization level M5 from the metallization level M6 is thicker than the insulating regions RIS10-RIS50.

Typically, in 32 nm technology, the thickness e1 of a region such as RIS56 is about 6000 ångströms. Moreover, as for the thickness e2 of the metallization level M6, this is about 8000 ångströms whereas the thickness of the metallization levels M1 to M5 is about 1150 ångströms.

FIG. 9, which illustrates two DRAM memory cells, shows that the bit lines BLC, BLT, the word lines WL1, WL2 and the global bit lines GBL are fabricated in the metallization levels M1, M2, M3, M4 and M5, respectively, whereas the capacitor CDS of each memory cell is fabricating in the insulating region RIS56 located above all these bit lines and word lines.

In the example given here, the top electrode of each capacitor is shared whereas the bottom electrodes are distinct, thereby providing one discrete capacitor per memory cell.

The shared top electrode of the capacitors CDS1 and CDS2 is connected to a metal track in the metallization level M6 whereas each bottom electrode of the capacitors CDS1 and CDS2 is connected to the electrode E1 of the transistors TR1 and TR2 by way of a via stack and metal track portions.

These vias and the metal tracks forming the various bit lines, word lines and global bit lines are fabricated, conventionally in a manner known per se, using a standard integrated-circuit BEOL fabrication process. Such a process in particular comprises depositing dielectric layers, forming cavities in theses layers and filling this cavities with one or more metals. Single damascene or dual damascene processes, well known to those skilled in the art, may in particular be used.

Moreover, placing the memory cell capacitors above all the bit lines, word line and global bit lines enables these capacitors to be fabricated in thick insulating regions. It is thus possible to fabricate high-capacitance capacitors even when particularly dense memory architectures are used, in particular when the memory architectures are fabricated in 32 nm technology.

Moreover, these thick insulating regions are generally fabricated with a material having a higher-k than the insulator used to encompass the lower metallization levels. Such a higher-k material, for example silicon dioxide, is more robust than the lower-k material and therefore three-dimensional capacitors may be more easily fabricated within it.

Furthermore, fabricating capacitors in the thick regions provides greater flexibility with regard to the constraints of form factor and filling of the cavities formed in the region RIS56 by the metal and dielectric layers that make up the electrodes and the dielectric of the capacitor.

Thus, by way of indication, as illustrated in FIG. 9, the height of each capacitor may be about 5000 ångströms.

This capacitor is preferably a three-dimensional metal-dielectric-metal capacitor fabricated conventionally and in a manner known per se.

Furthermore, a high capacitance enables sufficient charge transfer to be maintained because of a very favorable ratio between the capacitance of the capacitor and the total capacitance of the corresponding bit line.

Furthermore, the fabrication of the bit lines and the word lines does not require any special fabrication process.

Figure 10:
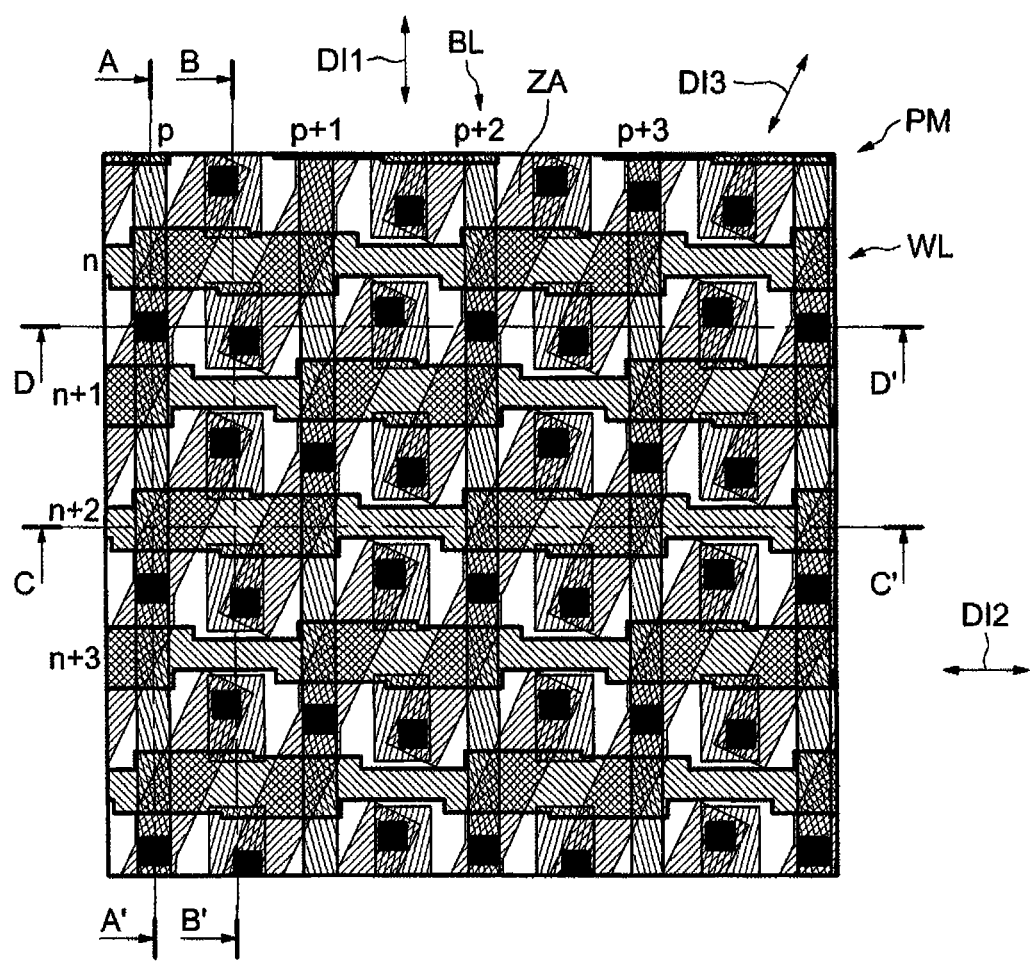

FIG. 10 shows an example of a layout of memory cells on the memory plane PM.

More precisely, the active regions ZA of the transistors are surmounted by polysilicon lines that form the gates of these transistors and that will be connected to the word lines WL extending parallel to these polysilicon lines.

Moreover, contacts are provided on the drains of the transistors so as to contact the bit lines BL located in the metallization level M1 and which are, in this example, vertically oriented, that is to say perpendicularly to the word lines WL, the word lines themselves being horizontally oriented.

Contacts are also provided on the sources of the transistors so as to be able to connect, by way of the via stack and metal-track portions, the bottom electrodes of the capacitors of the memory plane.

So as to enable this interconnection with the capacitors, as FIG. 10 shows, the active regions of the transistors are oriented in a principal direction DI3 different to the orientation direction DI1 of the bit lines and different to the orientation direction DI2 of the word lines.

In this example, the direction DI3 is oblique to the directions DI1 and DI2.

Even so, other configurations are possible.

Thus, it would be possible for the principal orientation of the active regions of the transistors to be vertical for the principal orientation of the word lines to be horizontal and for the principal orientation of the bit lines to be oblique.

FIGS. 11 to 14 illustrate, schematically, cross sections along the lines A-A', B-B', C-C' and D-D' of FIG. 10 respectively.

In these figures, for the sake of simplicity, the references used in FIGS. 4 and 5 to denote the metal tracks have not be used, instead the set of bit lines are denoted everywhere by BLT and BLC and the word lines by $WL_i$.

Moreover, taking account of the superposed twisted architecture of the bit lines and the word lines, the various tracks shown may be either a bit line BLT or a bit line BLC, or even a word line assigned to a cell n or a word line assigned to an adjacent cell.

Finally, the set of additional electrically conducting lines, that is to say the global bit lines, have been denoted by $GBL_p$, $GBL_{p+1}$, $GBL_{p+2}$ et $GBL_{p+3}$.

Indeed, FIGS. 11 to 14 again show the superposed structure of the bit lines and word lines.

Moreover, a global bit line is superposed on a bit line and the bottom electrodes of the capacitors are connected to the sources of the transistors by way of the via stack and metal-track portions that extend between the bit lines and the word lines.

Now referring again to FIG. 9, this shows that the global bit lines GBL have a high-capacitance environment. This is because there is a parasitic capacitance between the global bit lines GBL and the metal portions, located either side of the global bit lines, for connecting the memory cell capacitors to the electrodes E1 of the transistors and a parasitic capacitance between these global bit lines and each capacitor of the memory plane.

One way of reducing the parasitic capacitance between the global bit lines and the capacitors of the memory plane consists in raising the capacitors relative to the underlying metallization level M5 within which the global bit lines are fabricated. This raising may be effected, for example, by way of additional metal vias VX provided in a silicon oxide layer separated from the silicon oxide layer in which the capacitors are fabricated by a layer of silicon nitride CH56.

Because of their environment, these global bit lines, which are relatively long, are loaded lines, that is to say that they have a high resistance and a high capacitance RCWR and RCRD as illustrated in FIGS. 7 and 8.

Such high capacitances may be detrimental to certain applications because they increase the precharge time of these lines.

Figure 15:
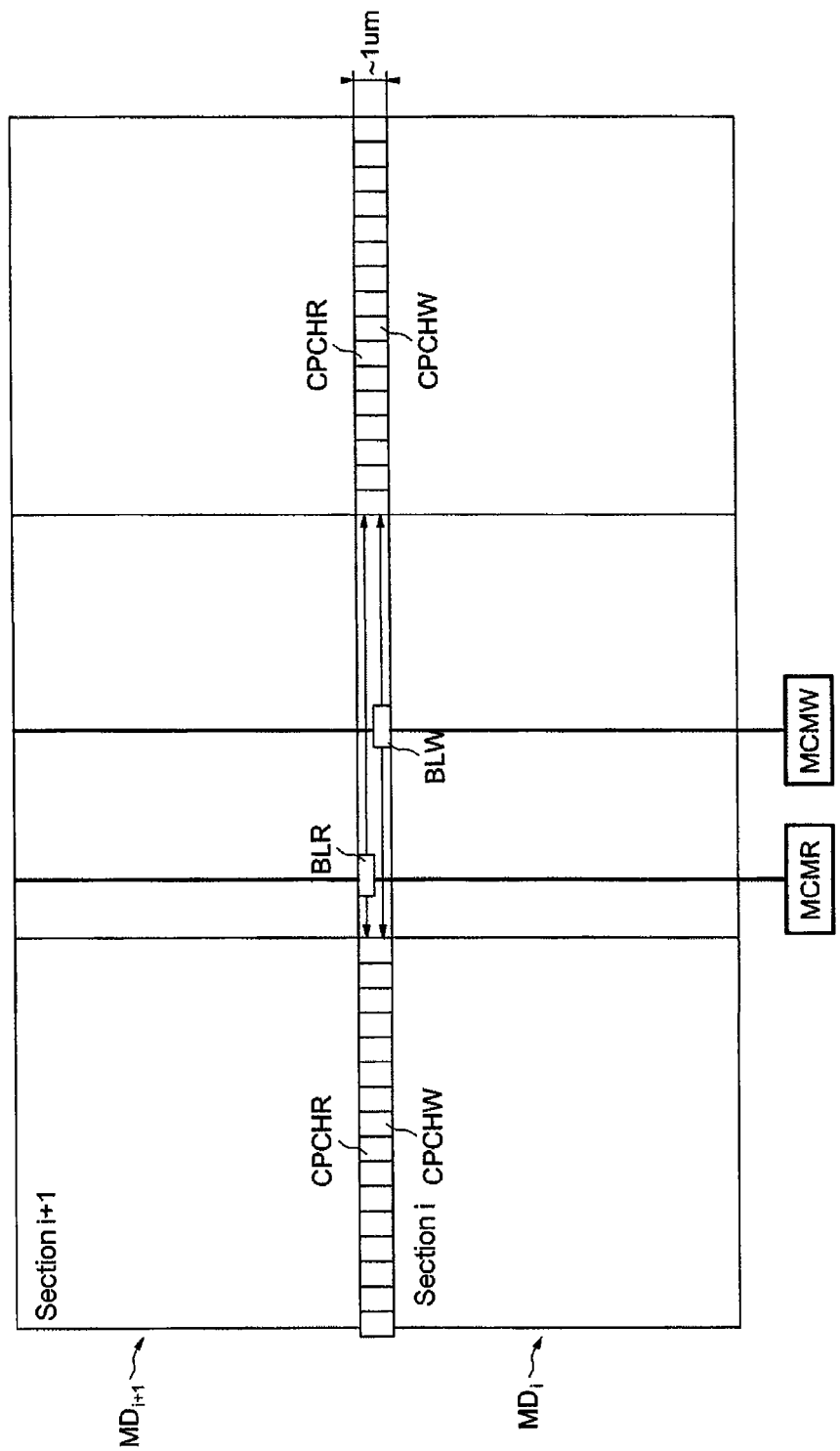
FIG. 15 illustrates schematically another embodiment of a memory device according to the invention.

To alleviate this drawback it is proposed, as illustrated very schematically in FIG. 15, to distribute several of these bit line precharge circuits CPCHR and CPCHW along these global bit lines, and, for example, between certain sections $MD_i$.

In practice, depending on the size of the memory, and consequently on the length of the global bit lines, and depending on the technology used, which directly affects the memory density, it is possible to provide, for example, a precharge circuit at each end of a pair of global bit lines for reading and a precharge circuit at each end of a pair of global bit lines for writing.

If this is not enough, it would then be possible to insert, every n sections, another precharge circuit connected to the pair of bit lines RDC and RDT and another precharge circuit connected to the pair of lines WRT and WRC.

Moreover, control means MCMR and MCMW, for example logic circuits, will deliver control signals to various logic blocks BLR and BLW which, in response to these control signals, will deliver the precharge signals that activate the corresponding precharge circuits.

This enables all the precharge circuits to be activated simultaneously (or virtually simultaneously, taking into account the signal propagation time).

Figure 16:
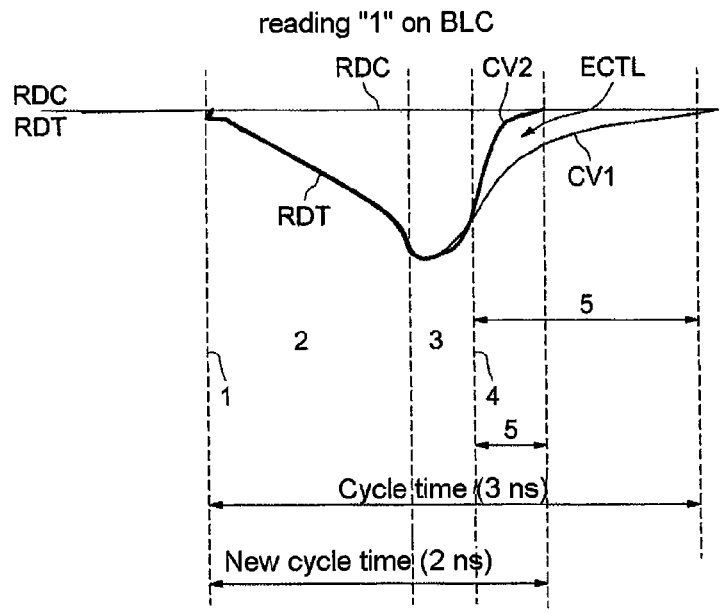
FIGS. 16 and 17 illustrate certain advantages of a memory device such as illustrated in FIG. 15.

FIG. 16 shows an operation for reading a datum, for example the reading of a logic "1" on the bit line BLC.

The reading of a datum is carried out conventionally in a manner known per se.

More precisely, the corresponding memory cell is selected using the corresponding word line and then the signal is transferred to the bit line BLT or BLC depending on the word line chosen—in the case described here, for example, the signal is transferred to the bit line BLC.

The sense amplifier SA amplifies the differential signal and transfers this signal to the global read-lines RDC and RDT.

The read cycle is carried out in five phases.

In a first phase, the precharge control signal of the lines RDC and RDT is deactivated. Next, in phase 2, the differential signal is transferred from the sense amplifier SA to the lines RDT and RDC.

In the case illustrated in FIG. 16, a "1" is then read on the bit line BLC, the potential of the line RDT drops, while the potential of the line RDC remains at its precharge value Vdd.

In phase 3, the datum read into the memory interface is detected and stored, then, in phase 4, the precharge of the lines RDT and RDC is activated.

At this point, as illustrated by the curve CV1, the potentials of the lines RDC and RDT are made equal to the voltage Vdd, enabling, at the end of phase 5, a new read cycle to be carried out.

The curve CV1 illustrates the case where there is only one precharge circuit on the lines RDT and RDC.

This typically leads, for example, to a cycle time of 3 nanoseconds for a 32 nm memory architecture.

On the other hand, when the lines RDT and RDC are equipped with several precharge circuits the duration of phase 5 is reduced, resulting in a shorter cycle time, typically of about two nanoseconds.

Such a cycle enables operations to be carried out at 500 MHz.

Figure 17:
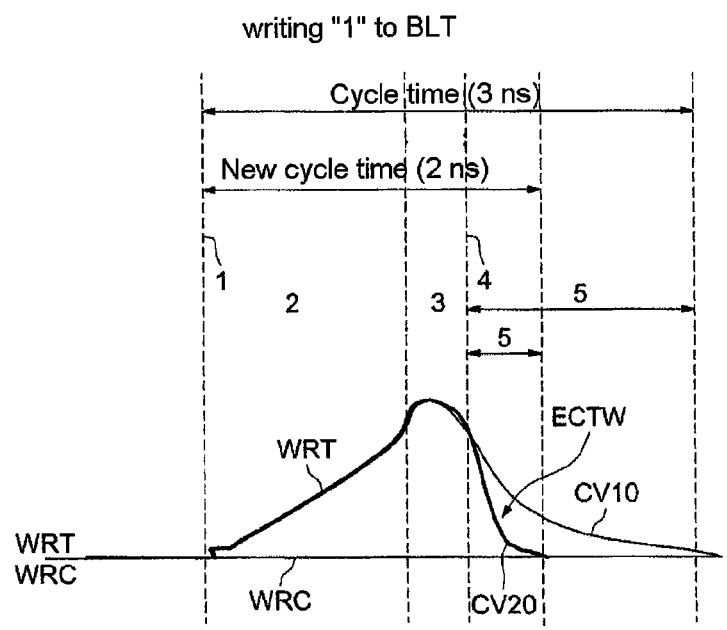

FIG. 17 illustrates a write cycle, for example the writing of a logic "1" to the bit line BLT.

Conventionally, and in a manner known per se, after having deactivated the precharge of the lines WRT and WRC, the transistor that connects the bit lines BLT and BLC to the lines WRT and WRC is turned on and the memory cell is selected using the corresponding word line.

The read control-means WRD then send a differential signal to the lines WRT and WRC and consequently to the bit lines BLT and BLC, thus erasing the datum contained in the memory cell selected.

The sense amplifier SA amplifies the differential signal and the new datum is written to the memory cell.

The write cycle also comprises five phases. At the point "1", the precharge control of the lines WRT and WRC is deactivated. Next, in phase 2, the differential signal is transferred from the memory interface to the lines WRT and WRC. In the example given, a "1" is then written and the potential of the line WRT increases, while the potential of the line WRC remains at its precharge value i.e. at ground voltage. In phase 3, amplification operations are carried out by the sense amplifier SA, then, at point 4, the precharge of the lines WRT and WRC is activated, making the potentials equal to the ground potential at the end of phase 5.

Here again, the curve CV10 illustrate a case in which there is only one precharge circuit connected to the pair of lines WRT, WRC.

On the other hand, when several precharge circuits are placed on the pair of lines WRT and WRC, a quicker precharge is obtained, as illustrated by the curve CV20, thereby making it possible, once more, to shorten phase 5 and therefore to obtain a new, shorter cycle time, typically of 2 nanoseconds, enabling a working frequency for the memory of about 500 MHz.

Figure 18:
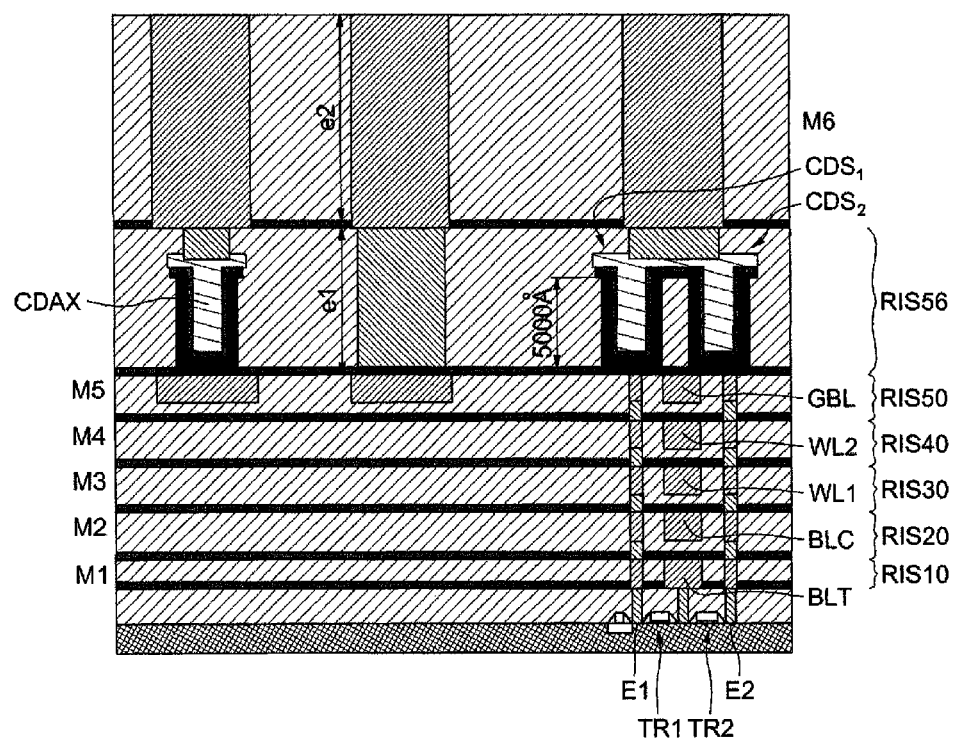
FIG. 18 illustrates another embodiment of an integrated circuit according to the invention.

Another embodiment of an integrated circuit will now be described with reference to FIG. 18.

In this embodiment, in addition to a DRAM memory device as described above, at least one additional capacitor CDAX, of identical structure to the memory cell capacitors, is provided, but is not connected to the transistors. Such capacitors may be used, for example, to decouple two adjacent metallization levels. Furthermore, it should be noted here that the fabrication of these decoupling capacitors is carried out simultaneously with the fabrication of the memory cell capacitors using the same process technology, which considerably simplifies the fabrication of the integrated circuits in this respect.

The invention claimed is:

1. An integrated circuit, comprising:
 a DRAM memory device comprising at least one memory cell, wherein the memory cell includes a transistor having a first electrode, a second electrode and a control electrode, and further including a capacitor coupled to said first electrode,
 wherein at least a first electrically conducting line having a width and length is coupled to the second electrode, and
 wherein at least a second electrically conducting line having a width and a length is coupled to the control electrode,
 wherein first and second electrically conducting lines are placed within the integrated circuit between the transistor and the capacitor,
 wherein the length of each first electrically conducting line principally extends in a first direction,
 wherein the length of each second electrically conducting line principally extends in a second direction, and
 wherein an active region containing the first and second electrodes of the transistor has a width and a length, and the length of the active region principally extends in a third direction different from the first and second directions.

2. The integrated circuit according to claim 1, further comprising metallization levels fabricated within first insulating regions, wherein said first and second electrically conducting lines are fabricated within certain of these metallization levels, and the capacitor is fabricated between two metallization levels within a second insulating region that is thicker than said first insulating regions.

3. The integrated circuit according to claim 2, wherein the first insulating regions comprise a material having a first permittivity and the second insulating region comprises a material having a second permittivity higher than the first permittivity.

4. The integrated circuit according to claim 2, wherein said capacitor is fabricated above the fifth metallization level.

5. The integrated circuit according to claim 1, wherein the active region of the transistor has a side edge defining at least a portion of the length that principally extends in the third direction.

6. The integrated circuit according to claim 1, wherein the memory device comprises an array of DRAM memory-cells, a set of first electrically conducting lines coupled to the second electrodes of the memory cell transistors and a set of second electrically conducting lines coupled to the control electrodes of the memory cell transistors,
   wherein all these sets of lines are respectively fabricated within different metallization levels, and the memory cell capacitors are fabricated in a least one metallization level above all these sets of electrically conducting lines.

7. The integrated circuit according to claim 6, wherein the memory device furthermore comprises a set of additional electrically conducting lines coupled to the first electrically conducting lines, this set of additional lines being fabricated in at least one metallization level located above metallization levels containing the sets of first and second lines.

8. The integrated circuit according to claim 7, wherein the memory cell capacitors are fabricated above the metallization level for the set of additional electrically conducting lines.

9. The integrated circuit according to claim 8, wherein the memory cell capacitors are at a level raised relative to the metallization level containing the set of additional electrically conducting lines.

10. The integrated circuit according to claim 7, wherein the set of additional lines comprises pairs of additional lines for writing data to the memory cells and pairs of additional lines for reading data from the memory cells, and
   wherein the integrated circuit further comprises several first precharge circuits assigned to each additional pair of lines for writing data, several second precharge circuits assigned to each pair of additional lines for reading data, a first control circuit configured to simultaneously activating all the first precharge circuits assigned to a pair of lines and a second control circuit configured to simultaneously activating all the second precharge circuits assigned to a pair of lines.

11. The integrated circuit according to claim 10, wherein the memory cell array is subdivided into array sections, and at least some of the first precharge circuits assigned to each pair of additional lines for writing data are located between certain sections, and at least some of the second precharge circuits assigned to each pair of additional lines for reading data are located between certain sections.

12. The integrated circuit according to claim 6, wherein the set of first electrically conducting lines comprises metal tracks extending so as to be vertically superposed and twisted pairwise over two different metallization levels, and the set of second electrically conducting lines comprises other metal tracks extending so as to be vertically superposed and twisted pairwise over two other different metallization levels.

13. The integrated circuit according to claim 12,
   wherein the memory device furthermore comprises a set of additional electrically conducting lines coupled to the first electrically conducting lines, this set of additional lines being fabricated in at least one metallization level located above metallization levels containing the sets of first and second lines; and
   wherein each additional line is placed above a metal track of the set of first electrically conducting lines.

14. The integrated circuit according to claim 12, wherein the set of first electrically conducting lines is fabricated in first and second metallization levels, the set of second electrically conducting lines is fabricated in third and fourth metallization levels and the set of additional electrically conducting lines is fabricated in a fifth metallization level.

15. The integrated circuit according to claim 6, wherein all the memory cell capacitors are fabricated in the same insulating region.

16. The integrated circuit according to claim 15, wherein said insulating region is located between a fifth metallization level and a sixth metallization level.

17. The integrated circuit according to claim 1, further comprising at least one additional capacitor, of identical structure to each memory cell capacitor, that is located in the same integrated-circuit insulating region containing each memory cell capacitor.

18. An integrated circuit, comprising:
   a substrate supporting a transistor including a source and drain formed in an active region having a width and a length;
   a first dielectric layer covering the substrate and transistor;
   a plurality of first metallization levels stacked above the first dielectric layer;
   a second metallization level positioned above the stack of first metallization levels, the second metallization level including a three-dimensional capacitor structure including a first plate and a second plate, the transistor and capacitor defining a memory cell;
   a first set of vias extending through the first metallization levels to electrically couple the second plate of the capacitor to the transistor source;
   a bit line for the memory cell having a width and a length and positioned in one of the first metallization layers vertically between the active region of the transistor and the second plate of the capacitor; and
   a word line for the memory cell having a width and a length and positioned in another one of the first metallization layers vertically between the active region of the transistor and the second plate of the capacitor;
   wherein the length of the bit line principally extends in a first direction,
   wherein the length of the word line principally extends in a second direction, and
   wherein the length of the active region principally extends in a third direction different from the first and second directions.

19. The integrated circuit as in claim 18, wherein the first metallization levels comprise a first layer supporting a true bit line, a second layer supporting a complement bit and a third layer supporting a word line.

20. The integrated circuit of claim 18, wherein the second metallization level has a thickness greater than a thickness of any of the first metallization levels.

21. The integrated circuit of claim 18, wherein the first metallization levels including insulating material having a first permittivity and the second metallization level includes insulating material having a second permittivity higher than the first permittivity.

22. The integrated circuit of claim 18 wherein the first set of vias are vertically stacked on top of each other.

* * * * *